United States Patent [19]

Hyman et al.

[11] Patent Number: 5,765,129
[45] Date of Patent: Jun. 9, 1998

[54] VOICE RECORDING AND PLAYBACK MODULE

[76] Inventors: Gregory E. Hyman, 2589 NW. 59th St., Boca Raton, Fla. 33496; Noah L. Kislevitz, 8 Massa La., Edgewater, N.J. 07020; Androc L. Kislevitz, 534 Summit Ave., Ridgewood, N.J. 07450; Adam L. Kislevitz, 190 Cedar St., Englewood, N.J. 07631

[21] Appl. No.: 528,242

[22] Filed: Sep. 14, 1995

[51] Int. Cl.⁶ .................. G10L 5/02; G10L 9/00
[52] U.S. Cl. ......................... 704/270; 704/278
[58] Field of Search ................... 395/2.79, 2.81, 395/2.83, 2.87; 84/603–607

[56] References Cited

U.S. PATENT DOCUMENTS

| | | |
|---|---|---|
| 1,732,036 | 10/1929 | Arthur. |
| 2,164,663 | 10/1939 | Ottofy. |
| 4,614,144 | 9/1986 | Sagara et al.. |
| 4,791,741 | 12/1988 | Kondo. |
| 4,949,327 | 8/1990 | Forsse et al.. |
| 5,045,327 | 9/1991 | Tarlow et al.. |
| 5,368,308 | 11/1994 | Darnell ...................... 273/429 |

OTHER PUBLICATIONS

Advertisement for *Babble*, Lewis Galoob Toys, Inc., 1988, pp. 84–85.

*Primary Examiner*—David R. Hudspeth
*Assistant Examiner*—Robert Louis Sax
*Attorney, Agent, or Firm*—Darby & Darby

[57] ABSTRACT

A recording and playback device that allows the user to record a desired message and then play back the message in either the order in which the message was recorded or in an order reversed from the order in which the message is recorded. The message is preferably stored in the proper, forward order and reversed only when reverse playback is desired. The message is re-recorded as desired, the previously recorded message being overwritten.

2 Claims, 3 Drawing Sheets

VOICE RECORDING AND PLAYBACK MODULE

BACKGROUND OF THE INVENTION

The present invention relates generally to a device for recording and playing back a message or other sound. More particularly, the present invention relates to a portable electronic module that records a spoken message and either replays the message as recorded (forward order) or in reverse such that a backwards message is replayed.

Devices that play back messages in their original form are known in the art. Early versions of such devices utilized phonograph records or other mechanical recording means which generally did not allow a user to record his or her own message. Such mechanical recording devices also generally did not provide means for re-recording a message, i.e., periodically replacing the recorded message with a new message. Moreover, such devices require mechanical activation and therefore physical exertion by the user, such as turning a crank to turn a record relative to a needle or pulling a strip on which a message had been imprinted.

Modern recording and playback devices typically utilize a speech synthesizer chip that is more readily activated by a user, such as by the mere pressing of a button. Such electronic playback devices also generally have not only a switch for playing a recorded message but also a switch for recording a desired message.

The message that is played back by known recording and playback devices is generally intended to sound as near as possible to the message as spoken during recording of the message. Accordingly, the currently known electronic recording and playback devices only allow for forward playback. No reverse playback has been contemplated or provided. Thus, the uses of currently available recording and forward playback devices are somewhat limited.

SUMMARY OF THE INVENTION

It is therefore a principal object of the present invention to provide a recording and playback device that not only permits the user to play back recorded messages to sound as they sounded when recorded, but also to play back the messages in reverse. The reversed messages can be used, for example, as codes or as a "secret" language by the user.

A related object of the invention is to provide a recording and playback device that permits selective recording and re-recording of messages and selective playback in either forward or reverse order until a new message has been recorded.

In accordance with the principles of the present invention a recording and playback device is provided that permits selective recording and re-recording of a desired message and selective playback of a message in either forward or reverse format. A preferred embodiment of the present invention utilizes an electronic recording device and a control device that selectively retrieves the message stored in the recording means in either the order in which it was recorded or in a reversed order.

These and other features and advantages of the present invention will be readily apparent from the following detailed description of the invention taken in conjunction with the accompanying drawings, wherein like reference characters represent like elements.

DESCRIPTION OF THE INVENTION

Figure 1:
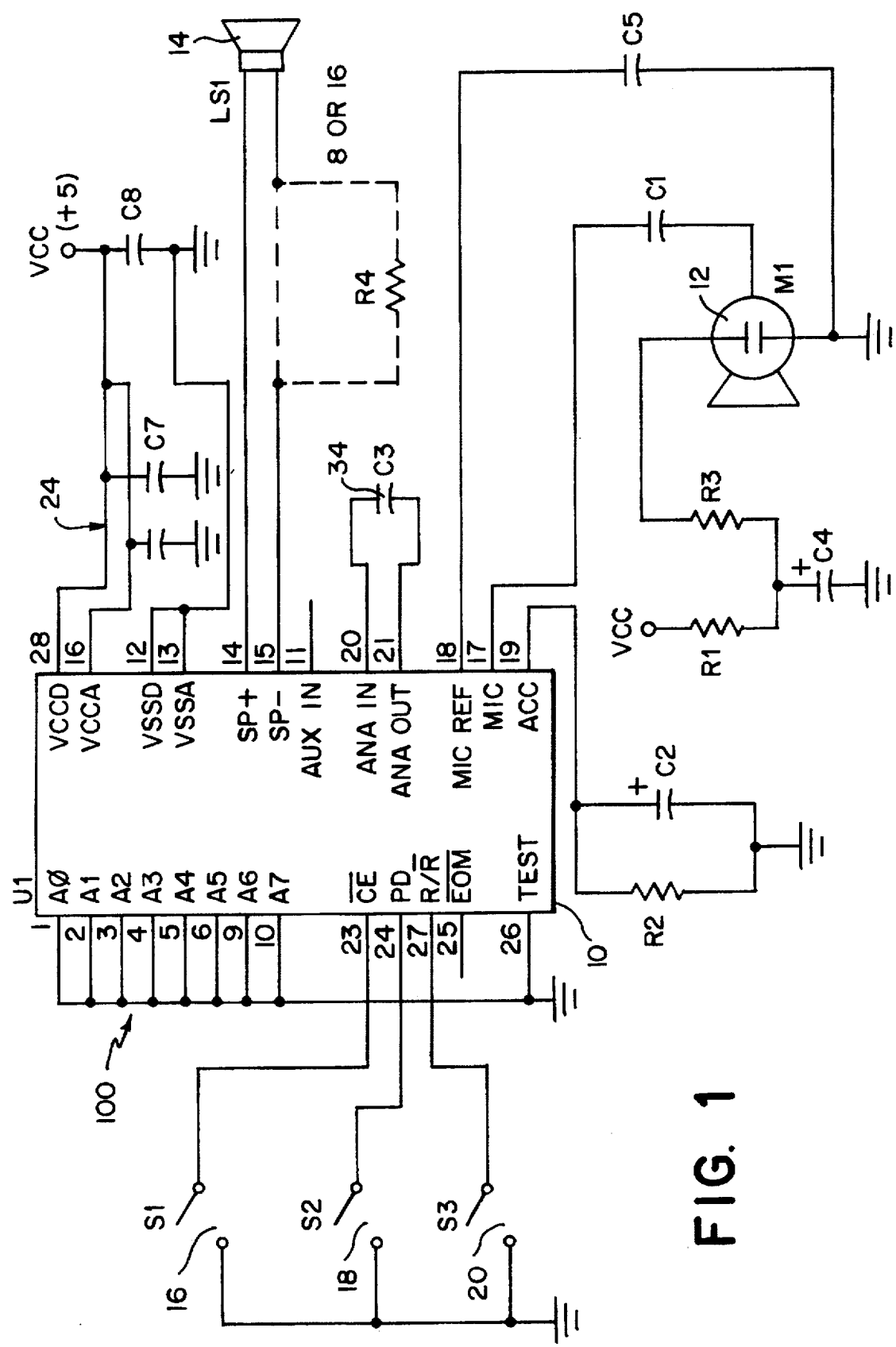
FIG. 1 is an electronic schematic block diagram of a recording and playback system in accordance with the principles of the present invention.

An electronic schematic block diagram of a preferred electronic system 100 for implementing the recording and playback device of the present invention is shown in FIG. 1. System 100 includes a speech synthesizer 10, to which microphone 12, speaker 14, and control switches 16, 18, 20 are electrically connected. Speech synthesizer 10 is preferably a single chip voice record/playback integrated circuit such as any of the ISD100A family of devices manufactured by Information Storage Devices, Inc. of 2841 Junction Avenue, San Jose, Calif. 95134, as will be discussed in greater detail below with reference to FIG. 2. The remaining components of the block diagram of FIG. 1 are commonly used in such circuits and are easily understood by one of ordinary skill in the art, and therefore do not form a part of the present invention.

Switches 16, 18, and 20 are preferably momentary single pole, single throw switches, such as shown, which may be activated by pressing buttons for as long as activation is desired. However, any other type of switch known to one of ordinary skill in the art may alternatively be used. A user records a message by closing recording switch 16 to thereby actuate the recording mechanism of speech synthesizer 10. The user then speaks into microphone 12 to record the desired message. Recording preferably is accomplished only while recording switch 16 is pressed or otherwise maintained in a closed position. Preferably, the recording mechanism of system 100 is set up so that any later made recordings cause earlier recordings to be erased and replaced. Thus, if recording switch 16 is opened after recording a message, a later closing of recording switch 16 will cause the recorded message to be erased and replaced with a new message. If desired, automatic erasure of a previously recorded message may be prevented unless the previously recorded message has been played back, at least once, in either the forward or reverse order, or both.

The message that is recorded upon pressing recording switch 16 and speaking into microphone 12 is stored in a memory section of speech synthesizer 10 preferably in the same order in which the message was created. Preferably, the duration of the recording is set for a predetermined time. Typically, the recording time is approximately six seconds, although longer recording times may be provided, if desired. If the user exceeds the time limit for recording, an alarm will sound and recording capability will automatically be terminated. The message recorded within the time limit will nonetheless be saved and may be played back when and if desired.

When the user wants to replay the message, the user may either press forward playback switch 18 or reverse playback switch 20. Upon depression of either forward or reverse playback switch 18, 20, the message is played via speaker 14. When forward playback switch 18 is closed, the message is played in forward order to sound as near as possible to the message that was initially recorded. However, when reverse playback switch 20 is closed, the message is played in reverse to play a backwards message over speaker 14. For example, if the phrase "I WANT MY PLAYBACK TOY" is recorded, the message will be replayed as "I WANT MY PLAYBACK TOY" when forward playback switch 18 is pressed, and as "YOT KCABYALP YM TNAW I" (message completely reversed from beginning to end) when reverse playback switch 20 is pressed. If desired, the device may be programmed to replay the message instead, as "I TNAW YM KCABYALP YOT" (individual words reversed but maintained in original order in series of words) when switch 18 is pressed. Details of playback will be discussed in further detail below.

Figure 2:
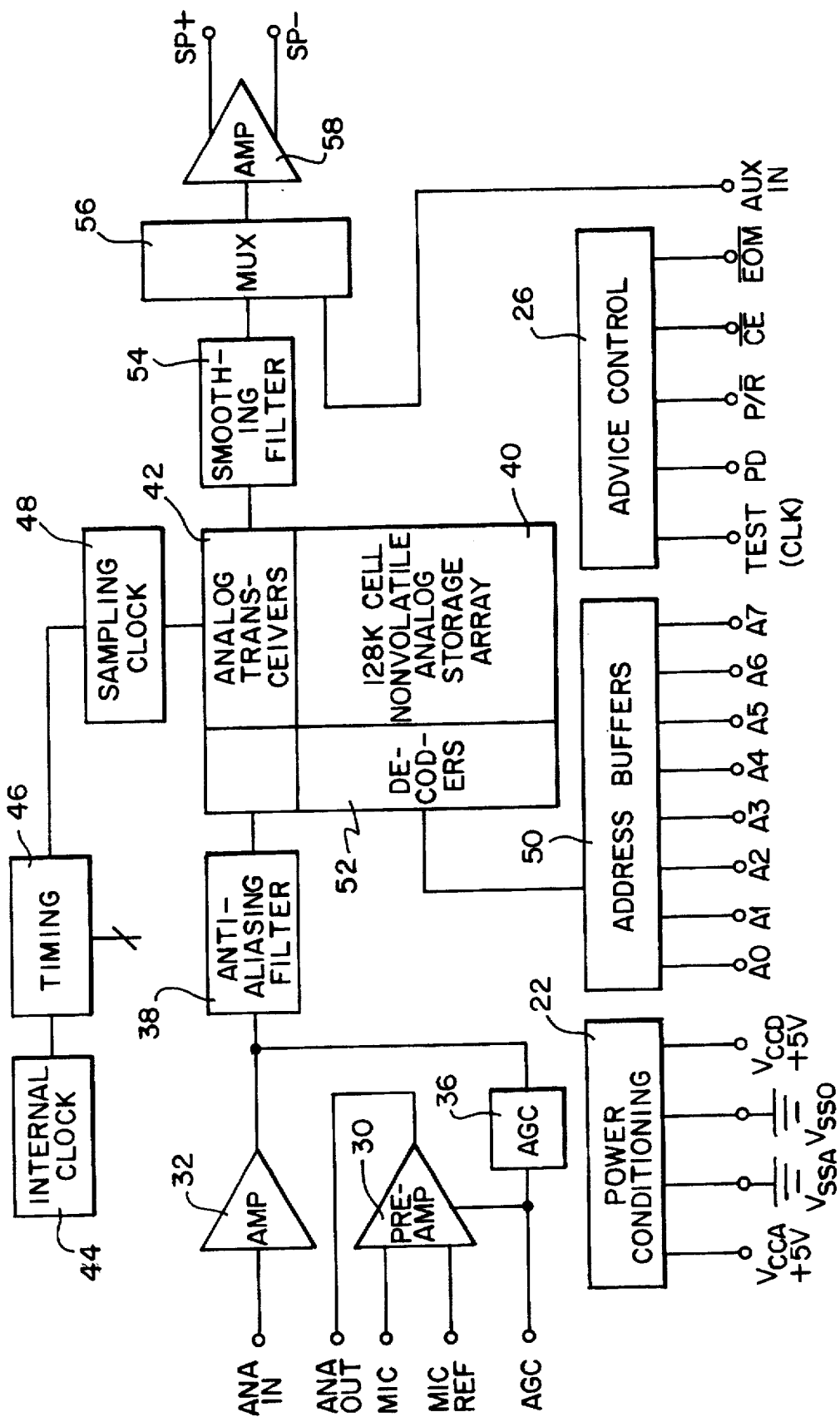
FIG. 2 is a block diagram of the functional sections of a speech synthesizer chip used in the present invention.

A preferred speech synthesizer chip 10 used in the recording and playback device of the present invention is diagrammed in FIG. 2. A conventional power conditioning module 22 supplies and controls power to the elements of chip 10 and is, itself, supplied with power via power source VCC (such as from batteries or an AC power supply) and filter capacitors 24 as shown in FIG. 1. When the user decides to record a message, the user must press recording switch 16, which indicates to chip 10, via device control module 26, that a message is to be recorded and stored in chip 10 for later playback. Device control 26 thus functions as an interface between the user and the components of chip 10. Auditory information is input via microphone 12 to speech synthesizer chip 10 via a pre-amplifier 30 which is connected to an amplifier 32 via capacitor 34 (FIG. 1). An automatic gain control 36 controls pre-amplifier 30 and amplifier 32 to control voice level, as is conventional. Antialiasing filter 38 removes alias frequencies (frequencies that are different from, but originating from the original frequency) which are produced when a speech signal is processed electronically. Thus, distortions in the speech waveform of the recording are reduced before storing the recording in memory 40. In the preferred speech synthesizer chip 10 of FIG. 2 (an ISD1012A, ISD1016A, or ISD1020A, manufactured by Information Storage Devices, Inc.), a nonvolatile analog storage array is the preferred type of random access memory (RAM) used. Such an array does not require the signal to be converted to digital form, but, through the use of analog transceivers 42, receives, stores, and transmits analog signals, thereby improving sound quality by reducing distortion and other losses caused by analog to digital and digital to analog conversions. It will be appreciated that any other desirable type of RAM or other memory may be used, such as an EEPROM, or a temporary memory that is not nonvolatile (i.e., that is volatile). Internal clock 44, timing block 46, and sampling clock 48 control the storage of messages, and synchronize the internal system of chip 10 as a whole.

When the user decides to play back the recorded and stored message, the user must press either switch 18 or 20 to cause device control 26 to cause address buffers 50 to scan memory 40 (through decoders 52). The recorded, stored message is then retrieved, in the desired order (depending on whether forward switch 18 or reverse switch 20 is pressed), and passed through smoothing filter 54, as is common in the art. A multiplexer 56 is typically provided in such chips as chip 10, but need not be utilized in practicing the principles of the present invention. The filtered signals are then passed through an amplifier 58 to cause speaker 14 to play back the pre-recorded message in the desired format.

Because memory 40 is addressable, if desired, a variety of messages may be stored in and retrieved from different addresses by address buffers 50 through commands from device control 26. Thus, a variety of messages may be recorded and played back in the order in which the message was recorded. However, speech synthesizer chips known in the art do not currently provide for retrieval or playing of stored information in an order reversed from the order in which the information was recorded. In order to be able to play back a backwards or reversed message, the speech synthesizer utilized in the present invention must be programmable to retrieve a stored message in a desired selected format. Thus, when a chip such as shown in FIG. 2 is used, the read only memory (ROM) (which includes device control 26 and address buffers 50) is preferably mask programmable to custom implement the desired program for retrieving stored messages in the desired order. The manner in which address buffers 50 scan information in memory 40 is thereby programmable and controllable. If a speech synthesizer without a ROM is used, then, for example, an electrically erasable programmable read only memory (EEPROM) may be used, along with the other necessary components as known in the art, to implement the desired information retrieval program as will next be described.

When the user presses forward playback switch 18 to play back the recorded message in the order in which the message was recorded, the ROM of chip 10 (including device control 26 and address buffers 50) scans the addresses in memory 40 in the usual manner to cause the message stored therein to be played in the order in which the message was recorded. However, when the user presses reverse playback switch 20 to play back the recorded message in an order reversed from the order in which the message was recorded, a special program, not presently implemented in currently available speech synthesizer chips, must be implemented, as follows.

Figure 3:
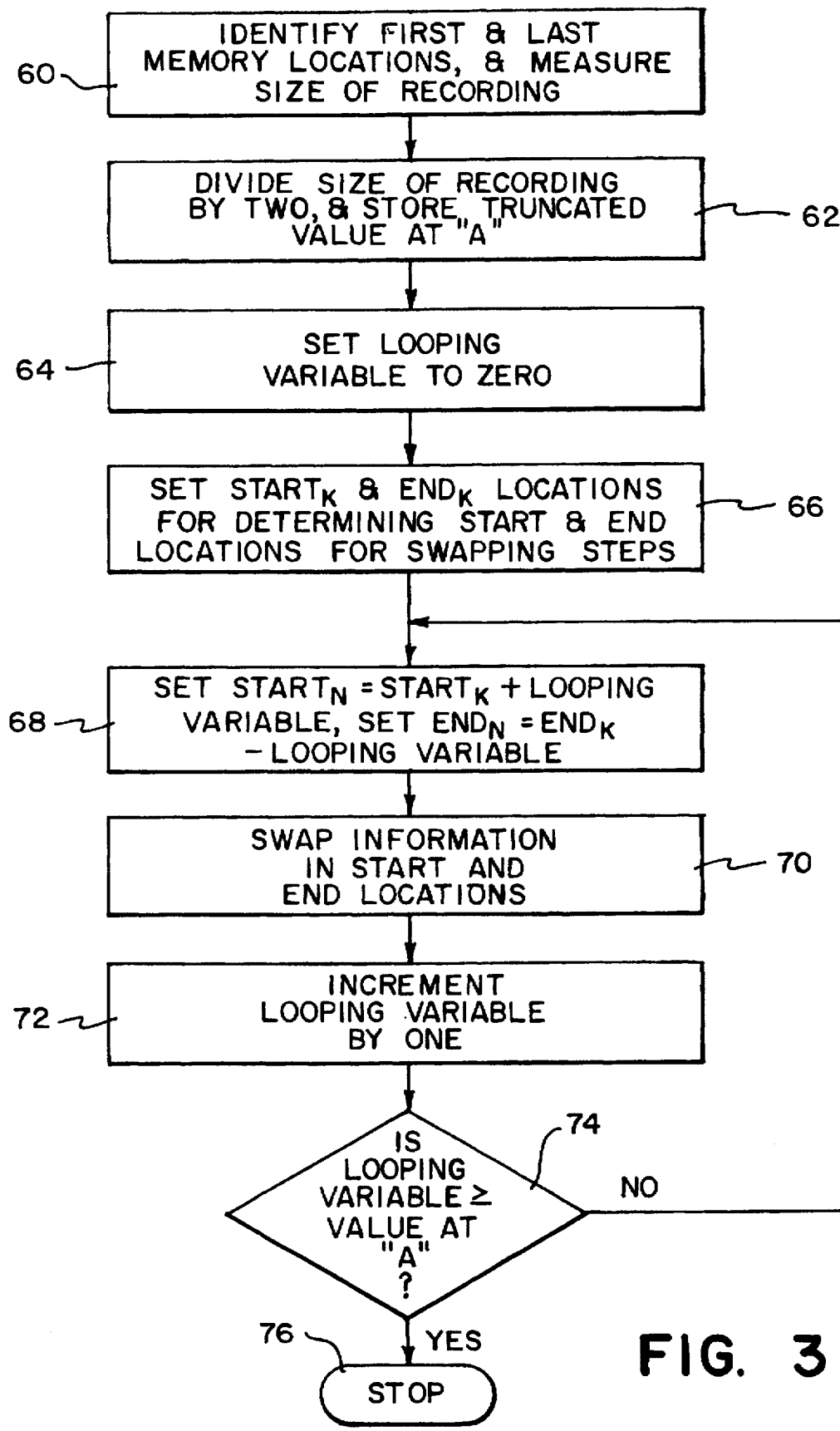
FIG. 3 is a flow chart showing the steps taken to play back the recorded message in a reversed order.

The steps taken in playing a recorded message in reverse are illustrated in the flow diagram of FIG. 3. Once a desired message is recorded in the manner described above, the first and last memory locations are identified and the size of the recording (i.e., the number of bytes occupied by the message in memory 40) is measured, as shown in step 60. The size of the recording is then divided in half, and that value is truncated and stored at a predetermined memory location designated as location "A", as shown in step 62. This calculation gives the midpoint of the block of the memory array occupied by the recorded message so that information can readily be swapped to reverse the order of the message on playback. These steps are preliminary to the actual swapping of information to reverse the order of the stored message. Preferably, reversal of the stored information only occurs upon depression of reverse playback switch 20 without being stored in memory, thus saving memory space. When reverse playback switch 20 is closed, the reversed information is played. Preferably, the information is restored to its original order and retained in memory in the original order rather than in both original and reverse orders (once again, to save memory space). Of course, if desired, the reversed information may be retained in memory, replacing the forward version, and the original format may be returned only upon pressing forward playback switch 18. Alternatively the reversed message may be stored in memory along with the forward version of the message. Thus, the contents of memory 40 preferably is not lost upon playback of the stored message. Of course, if desired, memory 40 can be purged after each playback.

In preparation for the swapping of the stored information, step 64 involves the setting of a loop variable, used during the swapping of information, to zero. Additionally, the $start_K$ and $end_K$ constants (used for determining locations to be swapped, as explained below) are set as the first and last memory locations used by the stored message (determined in step 60), as shown in step 66. The swapping steps may then be commenced.

First, as shown in step 68, the selected $start_N$ and $end_N$ locations for the information swap are set by adding the loop variable (which is progressively incremented) to the preset $start_K$ location and subtracting the loop variable from the preset $end_K$ location. This step establishes from which storage locations information is to be exchanged during a selected swap. Once the location from which information is to be swapped has been set by step 68, the information is swapped, as shown in step 70.

After each swap of information between a pair of $start_N$ and $end_N$ memory locations, the next locations from which information is to be swapped must be determined so that the swap progresses through the memory locations where the message is stored. In order for the swap to progress through the stored information, the $start_N$ location for swapping is incremented and the $end_N$ location is decremented to progress from the ends of the stored segment of memory to the middle of the stored segment of memory. The increment and decrement of the $start_N$ and $end_N$ locations are established by the loop variable value, which is incremented by step 72 after each swap of information, so that the $start_N$ and $end_N$ locations set by step 68 before each swap in step 70 progress through memory for successive swaps.

Decision step 74 determines whether the loop variable is equal to or greater than the value stored at location "A". The value stored at location "A" determines the midpoint of the storage array. Thus, if the loop variable is greater than or equal to the value at location "A", then the midpoint of the stored information has been reached, complete reversal of the information in the storage array has been achieved, and no further swapping is necessary. If the loop variable is greater than the value at location "A", any further swapping will be past the midpoint and will undo the desired previously performed swap of information. Swapping is then stopped, as shown in step 76. However, if the loop variable is not greater than or equal to the value at location "A", then further swapping is necessary to completely reverse the order of the stored message, and the program is looped back to step 68 for further swapping of stored information.

One or two buffers may be used to temporarily store information being swapped. Alternatively, the information may be progressively transferred, in reverse, to another block of memory in the array, thereby obviating the need for memory buffers and the need to divide the size of the array (step 62). In this alternative embodiment, the first byte of the message is assigned to the last byte of the new block of memory, and information from progressive locations is similarly transferred to the new block of memory until the end of the original file is reached.

The above swapping program can be implemented either for each individual word of a plurality of words making up the message, or for the entire message, as a whole. Moreover, any other desired implementation of a swapping program may be used, depending, among other things, on the platform of the speech synthesizer, the system processor, and the assembly language program used. Variations of implementations include, for instance, the use of a constant loop variable which is used to vary designated progressively increasing and decreasing start and end locations which are both stored at location "A". In this manner, the "current swapping position", rather than the loop variable, is varied each time a swap is to be performed.

Other implementations in accordance with the basic principles of the present invention are also contemplated. For instance, instead of reversing the order of individual words (i.e., playing reversed words), only the order in which the words are spoken in the sentence may be reversed. Thus, if the message "I'M HUNGRY" is recorded, the reverse switch 20 may cause the message to be played as "HUNGRY I'M"—with just the order of (unreversed) words being reversed. In both this implementation and the implementation in which individual words are reversed but the word order in the sentence is maintained, the recording and playback device must be able to distinguish between individual words. One way to facilitate proper separation of recorded words is to require the user to record each word separately. The automatic replacement of a recorded message upon subsequent pressing of recording switch 16 would not be implemented so that multiple, separate recordings can be accomplished. The swapping program can then act on the separately recorded words as separate units to provide a greater variety of reverse playback messages.

The recording and playback device of the present invention may thus be used as a game in which a recorded message is played in reverse as a "secret" message. Only with practice and experience can a user interpret the "secret" message. The user can play the "secret" message in forward, understandable English playback whenever desired because the forward and backward orders of the stored message are easily achieved, as described above. Additionally, the user may use the device of the present invention to learn the "secret" language by recording the words or phrases on the device and then pressing backwards playback switch 20. The user may then practice speaking the "secret" language by recording into the device the learned backwards words or phrases and replaying the backwards words or phrases (by pressing backwards playback switch 20) to check for accuracy. If the backwards words or phrases were properly learned, they will be replayed in proper, understandable English upon depression of backwards playback switch 20.

Another use for the device of the present invention is as a group game in which one of the players is an emcee. The emcee records a message and plays the message in reverse by pressing backwards playback switch 20. The first of the remaining players to guess the meaning of the message, i.e., decode the secret language into proper, understandable English, wins that round and becomes the next emcee. A variation of this use is as a car game in which the emcee records the name of an item on the road that the others in the car must find as they travel. The first to either call out or spot the item wins the round and becomes the next emcee.

Yet another use for the device of the present invention is with another similar device. A first device can send a "secret" reversed message to a second device by holding the two devices together and pressing backwards playback switch 20 on the first device and recording switch 16 on the second device. The "secret" reversed message can then be decoded by the second device at a later time by pressing its backwards playback switch 20 to play a backwards message in reverse, and thus proper, understandable English.

While the foregoing is a preferable embodiment for a recording and playback device, other configurations are possible. It will be understood that the device of the present invention may be embodied in any desirable structure. Lights may be used to indicate which of the switches, and thus which mode, has been selected. Additional switches may be provided if several messages are to be recorded and stored or if several reversed versions (e.g., whole sentence, individual words, word order, etc) may be played. Moreover, it will be understood that any desired speech synthesizer may be used which is capable of being programmed to implement the principles of the present invention. The above-described implementation is only a preferred embodiment of the principles of the present invention.

From the foregoing description, it will be clear that the present invention may be embodied in other specific forms without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A recording and playback device comprising:

a data storage memory in which a recorded sound message is stored in a forward order in a sequence of memory locations, each said memory location having an associated memory address signal such that the message is retrievable using a sequence of memory address signals;

a memory retrieval circuit for selectively retrieving said sound message from said data storage memory either in the forward order in which said sound message is stored in said device or in an order reversed from the forward order, said memory retrieval circuit retrieving said sound message in a reversed order by reversing the order in which said sound message is stored in said sequence of memory locations and retrieving the reversed sound message from said sequence of memory address signals such that said sound message retrieved therefrom is in an order reversed from the order in which said sound message is originally stored;

a speech synthesizer electrically connected to said memory retrieval circuit, said speech synthesizer receiving and enunciating said sound message retrieved from said data storage memory by said memory retrieval circuit;

a playback switch for actuating said memory retrieval circuit to selectively retrieve said recorded sound message in either a forward or reversed order;

said memory retrieval circuit further including a device control module for reversing the order in which said sound message is stored in said data storage memory when said switch actuates said speech synthesizer to play back said sound message in reversed order; and said device control module including a swapping unit that calculates the length of the memory sequence corresponding to the stored sound message, determines the first and last memory locations of said sequence, and calculates the midpoint of the sequence of memory locations and then sequentially swaps the information at the beginning of said sequence of memory locations with the information at the end of said sequence of memory locations progressively from the first location and the last location towards the midpoint of the recorded message, such that once the midpoint of the message is reached, the order of the message stored in said sequence of memory locations has been reversed.

2. A method of recording and playing back messages, said method comprising the steps of:

recording a sound message by storing the message in a sequence of memory locations in a data storage memory;

selectively retrieving and playing the stored message either in the order in which the sound message was recorded, by accessing said sequence of memory locations to retrieve the sound message stored therein in the order in which the sound message was recorded, or in an order reversed from the order in which the sound message was recorded by reversing the order in which the sound message is stored in said sequence of memory locations and then accessing said sequence of memory locations to retrieve the reversed sound message stored therein;

reversing the order in which the sound message is stored in said sequence of memory locations only when playing the stored sound message in an order reversed from the order in which the sound message was recorded, said step of reversing the order of said memory addresses further comprising the steps of:

calculating the length of the memory sequence corresponding to the stored sound message;

determining the first and last memory locations of said sequence;

calculating the midpoint of the sequence of memory locations; and sequentially swapping information in a memory location from the beginning of the sequence of memory locations with information in a memory location from the end of the sequence of memory locations progressively from the first memory location and the last memory location to the next memory locations closer to the midpoint of the sequence of memory locations, such that once the midpoint of the sequence of memory locations is reached, the order of the message in said sequence of locations has been reversed.

* * * * *